United States Patent

[11] 3,596,183

[72] Inventor Rolf E. Spies
Lyons, Ill.
[21] Appl. No 817,379
[22] Filed Apr. 18, 1969
[45] Patented July 27, 1971
[73] Assignee Motorola, Inc.
Franklin Park, Ill.

[54] MULTIBAND TUNING CONTROL SYSTEM WIGH PROGRAMMABLE ELECTRONIC SWITCHING
6 Claims, 1 Drawing Fig.

[52] U.S. Cl. .......... 325/465, 334/7, 334/15, 334/55, 334/87, 178/DIG. 15
[51] Int. Cl. .......... H03j 5/24
[50] Field of Search .......... 178/178.6; 325/422, 464, 465, 470; 334/15, 7, 55, 87

[56] References Cited

UNITED STATES PATENTS

| | | | |
|---|---|---|---|
| 3,252,095 | 5/1966 | Carlson | 325/464 |
| 3,264,566 | 8/1966 | Kaufman et al. | 325/465 |
| 3,354,397 | 11/1967 | Wittig | 334/15 |
| 3,503,018 | 3/1970 | Cavanagh | 325/464 |
| 3,505,620 | 4/1970 | Miner | 325/422 |
| 3,509,467 | 4/1970 | Cole | 325/465 |

*Primary Examiner*—Robert L Griffin
*Assistant Examiner*—James A Brodsky
*Attorney*—Mueller and Aichele

ABSTRACT: Tuning of a television receiver capable of receiving signals in the UHF and VHF bands of frequencies is controlled by an electronic ring counter circuit, the outputs of which are supplied through manually settable switches for selecting either the UHF or the high or low portions of the VHF bands. The band is selected by supplying a DC operating potential to the tuning circuit for the desired band through the switch connected to an energized stage of the ring counter. Each of the tuners is tuned to selected channels by a varactor diode tuning circuit, and the DC tuning voltage for the varactor diodes also is obtained from the energized stage of the ring counter, but is supplied through an adjustable potentiometer for each stage. Thus, any one of the stages of the counter may be adjusted to tune the receiver to any of the desired UHF or VHF channels by proper setting of the switch and the potentiometer for that stage of the counter. Provision is made for stepping the counter to the stage which is set to correspond to the desired band and channel within that band in order to effect electronic selection of the channel which is to be received.

PATENTED JUL 27 1971 3,596,183
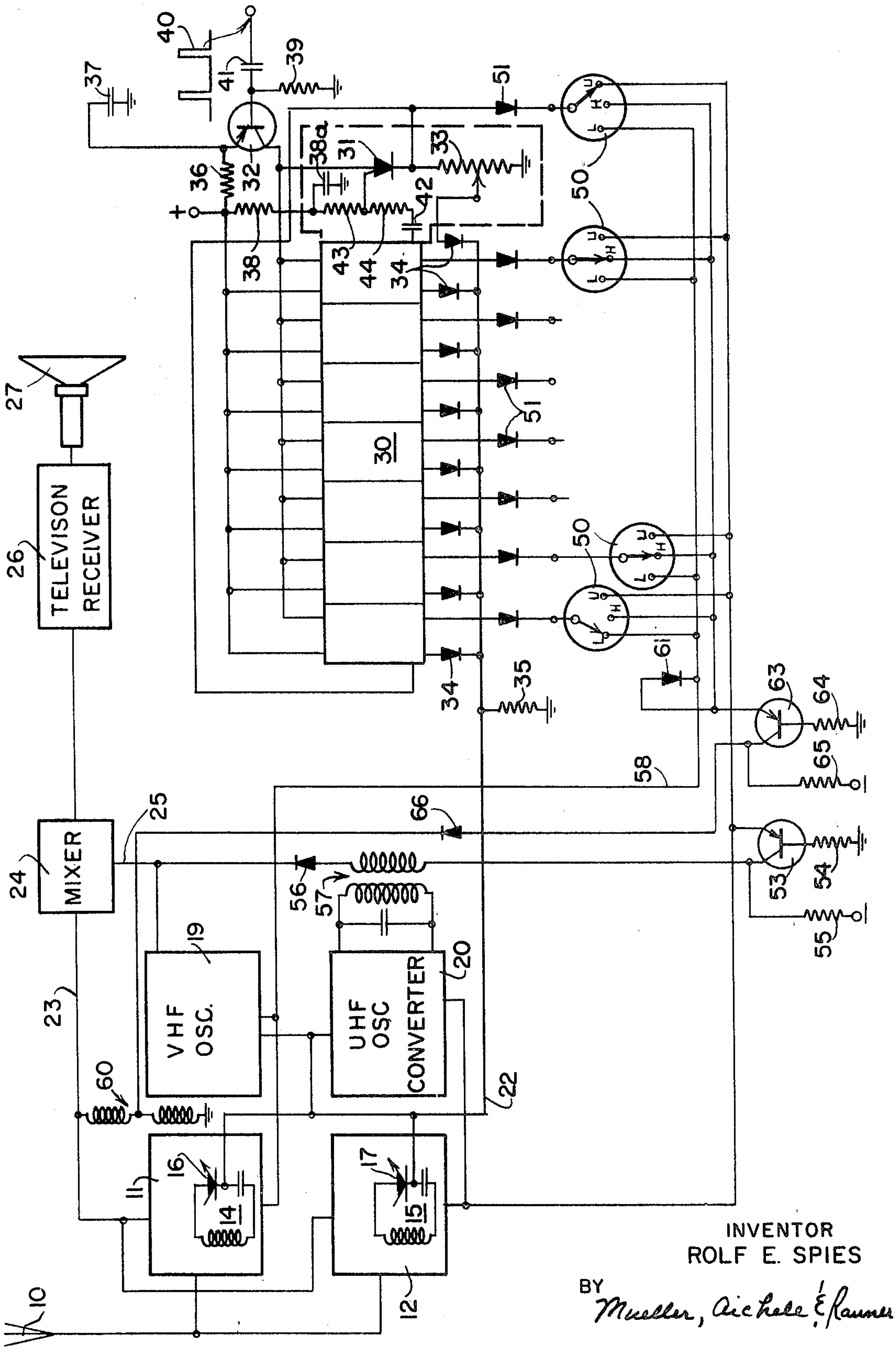
INVENTOR
ROLF E. SPIES
BY Mueller, Aichele & Rauner
ATTYS.

MULTIBAND TUNING CONTROL SYSTEM WIGH PROGRAMMABLE ELECTRONIC SWITCHING

BACKGROUND OF THE INVENTION

Present television receivers are adapted to receive both high frequency (VHF) and ultrahigh frequency (UHF) television broadcast signal bands. The VHF tuner generally is of a rotary preset channel tuning type and covers the 12 broadcast channels (2 to 13) in the lower frequency VHF band. This tuner may be manually operated or motor driven and includes a rotary mechanical control element, such as a control shaft, movable in steps progressively through detent-controlled channel tuning positions over a full rotational range of movement in either direction.

The UHF tuners generally employed also are of a rotary type but, instead of being detent controlled, are of the continuous tuning type, covering the 70 broadcast channels (14 to 83) in the higher frequency UHF band. Tuners of this type have a control shaft for continuous rotational tuning movement but of less than one full rotation of the shaft.

In order to switch between the VHF and UHF bands, it is necessary to set the VHF tuner to a UHF position (the channel 1 position). In this position the VHF tuner is disconnected from the receiver, and the UHF tuner is connected; so that control of the channels being received is under the control of the setting of the UHF tuner. Whenever the VHF tuner is in any of its other positions, the UHF tuner is disconnected from the receiver or is disabled; so that control of the received channel then is effected by the setting of the VHF tuner.

In addition, the mechanical VHF and UHF tuners are relatively large and cumbersome and are subject to the problems of wear and adjustment normally associated with mechanical devices of this type. The construction of these mechanical tuners is sufficiently complicated to make the tuners relatively expensive to manufacture thereby resulting in an increased cost of the television receiver.

SUMMARY OF THE INVENTION

Accordingly, it is an object of this invention to electronically tune a television receiver.

It is another object of this invention to electronically tune a television receiver to preselected VHF and UHF channels in any desired order.

It is a further object of this invention to control the tuning of a multiband television receiver by the use of a stepping counter.

In accordance with a preferred embodiment of this invention, a multiband television receiver is tuned under the control of a countercircuit having a plurality of stages, one of which is energized at a time, with the outputs of the stages being connected in common to provide variable DC tuning voltage to voltage variable tuning elements in the tuning circuits for the receiver. The tuning voltage thus is controlled by the output of the selected stage, and means are connected to the output of each stage for energizing for operation the tuner for the band which is to be selected by each stage of the counter when it is energized. In addition, a means is provided for advancing the counter to energize different stages in order to cause tuning of the television receiver in accordance with the outputs from the different stages of the counter.

BRIEF DESCRIPTION OF THE DRAWING

The sole FIGURE of the drawing is a schematic diagram of a preferred embodiment of the invention used in conjunction with a television receiver.

DETAILED DESCRIPTION

Referring now to the drawing, there is shown a wave signal receiver in the form of a television receiver capable of receiving television broadcast signals in the VHF and UHF bands. Incoming signals are coupled from an antenna 10 to a VHF tuner 11 and a UHF tuner 12. Included in the VHF and UHF tuners 11 and 12 are electronically tuned antenna tuning circuits and RF amplifier tuning circuits of a conventional nature. For this reason, these components and their interconnections have not been shown in detail; but the electronic tuning circuits are illustrated by the tank circuits 14 and 15 utilizing voltage variable capacitors 16 and 17, respectively. The voltage variable capacitors preferably are in the form of varactor tuning diodes, which exhibit a change in capacitance in accordance with the back-biasing DC tuning voltage which is applied to the cathodes thereof. The tuning circuits 14 and 15 also include a coil and a blocking capacitor normally used in varactor diode tuning circuits. As is well known, when the voltage applied to the varactor diodes 16 and 17 is varied, the resonant frequency of the tuning circuits is varied accordingly; so that the circuits 14 and 15 may be tuned over a relatively wide range of frequencies in order to select the proper channel within the bands capable of selection by the tuners 11 and 12.

Also associated with the tuners 11 and 12 are a pair of local oscillators, including a VHF oscillator 19 and a UHF oscillator/converter 20. These oscillators also may be electronically tuned with a varactor diode tuning circuit similar to the tuning circuits 14 and 15 used in the tuners 11 and 12. Since the oscillator output frequencies must track the output frequencies of the tuners 11 and 12, it is possible to tune the oscillators 19 and 20 with the same tuning voltage which is applied to the varactor diodes 16 and 17 in the tuners 11 and 12. Thus, the DC tuning voltages for all of the tuned circuits in the tuners 11 and 12 and the oscillators 19 and 20 may be obtained over a single lead 22.

In order to provide the IF signals for processing by the remainder of the television receiver, the outputs of the tuners 11 and 12 are applied over a lead 23 to one input of a mixer circuit 24. The other input to the mixer circuit 24 is obtained from the outputs of the oscillators 19 and 20 over a lead 25; and the mixer 24 provides an IF frequency output in a conventional manner to the remainder of a television receiver 26, which may be either a black and white or a color television receiver for processing received television signals to form signals suitable for driving a cathode-ray tube 27 to display television images thereon. The television receiver 26 may be of a number of different conventional configurations, and for that reason has not been shown in detail in the drawing.

In order that the television receiver 26 is supplied with signals corresponding to a single received channel, only one of the tuners 11 or 12 and the corresponding oscillator 19 or 20 is provided with a DC operating or energizing potential at any given time. Thus, the signals applied to the mixer 24 are either from the VHF tuner 11 and its associated oscillator 19 or from the UHF tuner 12 and its associated oscillator 20. The other tuner and associated oscillator is inoperative.

In order to select the desired channel from the many available in the UHF and VHF bands to which the television receiver may be tuned, a ring counter 30 is provided and has eight stages corresponding to eight preselected channels to which the television receiver can be preprogrammed. All of the stages of the ring counter 30 are alike, so that only the final or eighth stage thereof has been shown in detail. Each stage of the ring counter 30 includes a programmable unijunction transistor (PUT) 31, having the anode connected to the collector of a PNP control transistor 32 and having the cathode connected through a potentiometer 33, an isolating diode 34, and a resistor 35 to ground. The transistor 32 is normally conductive and supplies a positive potential, which is delayed by an RC circuit including a resistor 36 and a capacitor 37, to the anodes 31 of the PUTs. This delay biases all of the anodes of the PUTs negatively with respect to the gates and assures that all of the PUTs are turned off. However, only the eighth stage, which is shown in detail, has a gate delay circuit comprising a resistor 38 and a capacitor 38_a_, which renders the eighth stage conductive upon initial application of power to the counter 30, assuring that the ring counter 30 always starts at the same channel. Forward bias for the transistor 32 is obtained by connecting the base of the transistor 32 through a base resistor 39 to ground.

In order to advance the ring counter 30, the transistor 32 is rendered momentarily nonconductive by the application of a positive pulse 40 to its base through a coupling capacitor 41. When the transistor 32 is nonconductive, the flow of current to the ring counter 30 and through the stage of the ring counter which was conducting just prior to the time the transistor 32 was rendered nonconductive is interrupted. Thus the conductive PUT 31 is rendered nonconductive.

Resumption of conduction of the transistor 32 then takes place after the momentary pulse 40 terminates, reapplying the positive potential to the anodes of the PUTs 31. A trigger or gating pulse from the stage of the ring counter 30 which previously was conducting is applied by means of a capacitor 42 through a resistor 44 to the gate of the next successive PUT 31 to render that PUT conductive.

The ring counter 30 is a conventional ring counter and other configurations using different numbers of stages and other types of circuit components may be utilized. The counter must be of the type in which only a single stage is energized at any given time to provide current flow therethrough from the source of positive potential.

The tuning voltage from the energized stage of the counter 30 is applied from the tap 33 of the potentiometer for the energized stage through the isolating diode 34 and over the lead 22 to the tuners 11 and 12 and the oscillators 19 and 20 to effect the tuning of the tuned circuits therein. The particular voltage which is applied depends upon the setting of the tap on the potentiometer 33, and this tap may be adjusted to a different position for each of the different stages in the ring counter 30.

Since the tuner shown in the drawing is a multiband tuner, it also is necessary, in addition to tuning the tuned circuits in the tuners, to provide a means for selecting the particular tuner associated with the band of frequencies in which the desired channel is located. In order to do this, the cathodes of the PUTs 31 in each of the stages of the ring counter 30 are connected to a three-position manually operated switch 50. Since all of switches 50 are alike, only four have been shown in order to avoid unnecessary cluttering of the drawing.

The switches 50 are connected by means of isolating diodes 51 to the cathodes of the SCR devices 31 and may be set to any one of three positions, labeled in the drawing U, H and L. The U position corresponds to the selection of the UHF band of broadcast signals, while the H and L positions both correspond to the VHF broadcast signal bands, with H being associated with the upper frequencies of the VHF band and the L position being associated with the lower frequencies of the VHF band.

Assume for the moment that the energized stage of the ring counter is associated with a switch 50 set to the U position. In such an event, positive DC potential is applied by the conductive SCR 31 in the energized stage, through the isolating diode 51 to the U terminal of the switch. The output from the U terminal then is connected directly to the UHF tuner 12 and the UHF local oscillator 20 to provide the operating B+ potential for these components. All of the U positions of the switches 50 are connected in common, so that any time an energized stage of the counter 30 having its associated switch 50 connected to the U terminal is energized, this positive operating DC potential is applied to the tuner 12 and the oscillator 20.

At the same time, a UHF control transistor 53 is forward-biased by the application of the positive potential to its emitter, since the base of the transistor 53 is connected through a resistor 54 to ground. When the transistor 53 is rendered conductive, the potential at its collector rises to a positive value from the negative potential it normally provides when the transistor is nonconductive due to the coupling of the collector through a resistor 55 to a source of negative potential. The positive potential on the collector of the now conductive transistor 53 is applied to forward bias a switching diode 56 connected between the secondary winding of the output transformer 57 of the UHF oscillator 20 and the input to the mixer 24. As a consequence, the output signals applied to the primary winding of the transformer 57 from the now operating UHF converter 20 are coupled from the secondary winding of the transformer 57 through the conductive diode 56 over the lead 25 to the mixer 24.

At the same time, the VHF tuner 11 and the VHF oscillator 19 are inoperative, because no DC operating potential is applied to them since the VHF positions L and H of the switch 50 are open for the energized stage of the counter 30 in the example presently under consideration. The television receiver 26 is tuned to the particular UHF channel which is preselected by the setting of the potentiometer 33 for the stage of the ring counter 30 which has been energized.

Now assume that a lower frequency VHF channel is selected by the switch 50 associated with the energized or selected stage of the ring counter 30. In this event, the switch 50 is closed to the "L" contact, providing a DC potential over a lead 58 to the VHF tuner 11 and VHF oscillator 19 as DC operating potential for these elements. At the same time, the UHF tuner 12 and UHF oscillator 20 no longer are provided with DC operating potential, so that these circuit elements are effectively disconnected from operation in the receiver. At the same time, the transistor 53 no longer is forward biased, since its emitter is connected to an open circuit. The potential on the collector of the transistor 53 then rises to the negative potential applied to the resistor 55, causing the diode 56 to be back-biased, thereby isolating the UHF oscillator circuit from the lead 25.

At this time, the output of the VHF oscillator is applied over the lead 25 as one input to the mixer while the output of the VHF tuner is applied over the lead 23 to the other input of the mixer 24. The television receiver 26 then is tuned to the particular lower frequency VHF channel to which the diode 16 in the VHF tuner is biased by the setting of the potentiometer 33 in the energized stage of the ring counter 30. The output of the VHF tuner 11 for these lower frequency VHF signals also appears across both portions of the VHF tuning coil 60.

Finally, assume that the three-position switch 50 for an energized stage of the ring counter 30 is set to its center position H, corresponding to the high frequency portion of the VHF band. In this position, once again a positive DC operating potential is applied from the switch 50 to the lead 58 through an isolating and coupling diode 61 to the tuner 11 and the oscillator 19. At the same time, the UHF tuner 12 and oscillator 20 are nonoperative since no DC operating potentials are applied thereto. Also, the transistor 53 is nonconductive so that the diode 56 continues to be back-biased, decoupling the UHF oscillator output transformer 57 from the circuit.

In addition, however, a PNP transistor 63 is forward biased by the positive potential applied to its emitter since the base of the transistor 63 is connected through a base impedance 64 to ground. The collector of the transistor 63 is connected through a resistor 65 to a source of negative potential; so that whenever the transistor 63 is nonconductive, a coupling diode 66 connected between the collector of the resistor 63 and the center tap of the tuning coil 60 is back-biased, operating as an open switch in the circuit. When the transistor 63, however, is rendered conductive, the diode 66 is forward biased and operates to shunt the lower portion of the tuning coil 60 so that the output of the VHF tuner 11 corresponds to the desired high frequency portion of the VHF band.

From the foregoing it should be apparent that the selection of channels in both the VHF and UHF bands may be made on a random basis depending upon the particular settings of the switches 50; and, in addition, the selection of the particular channels within any selected band also is on a random basis for any given stage of the ring counter 30, as established by the position of the tap on the potentiometer 33. Any one of the stages of the ring counter 30 may be adjusted to tune the television receiver to any of the channels within the different bands. The stepping from channel to channel is effected by the application of the stepping pulses to the base of the transistor 32, and this stepping may be either fast or slow depending upon the rate at which these pulses are applied. In addition, random channel switching can be accomplished by connecting the gate of any PUT in the counter 30 to its cathode by means of a single pole pushbutton switch, or the like, if such operation is desired.

I claim:

1. In a multiband wave signal receiver having an electronic tuning circuit for each band, a control circuit for selecting the proper band and tuning the tuning circuits including in combination:

voltage variable tuning elements in said tuning circuits for each of the bands constituting the tunable elements thereof;

means for supplying a source of DC operating potential;

a counter circuit having a plurality of stages, each including a switching device for coupling said source of DC potential to an output of the corresponding stage, only one of the stages of said counter circuit being energized at a time by conduction of a switching device to couple said source of DC operating potential to the output thereof;

a plurality of potentiometers each coupled between the output of a different stage of said counter circuit and a point of reference potential, each potentiometer having a movable tap thereon for selecting a particular output tuning voltage to be obtained from the stage to which said potentiometer is connected, the taps of all of said potentiometers being connected through isolating diode means in common to said voltage variable tuning elements in said tuning circuits for supplying tuning voltages thereto;

the taps of said potentiometers in each of the stages being individually adjustable so that a variable DC voltage is applied to the tuning circuit in accordance with the adjustment of the potentiometer of whichever stage of said counter is energized at any particular time;

a plurality of switch means, each having an input connected to the output of a different stage of said counter circuit, at least some of said switch means having a plurality of individually selectable outputs, each connected with different tuning circuits in said wave signal receiver, for coupling a DC operating potential from the output of the energized stage of said counter through the switch means connected thereto to the tuning circuit connected to the selected output of the switch means to provide a DC operating voltage for the tuning circuit selected by the switch means connected to the energized stage of said counter.

2. The combination according to claim 1 wherein each of said switch means has outputs connected with each of said tuning circuits with means for interconnecting the input with a selected one of the outputs.

3. The combination according to claim 1 wherein the tuning circuits include local oscillators and the energization of different stages of said counter operates to couple the outputs of the local oscillators to the television receiver in accordance with the settings of the switch means.

4. The combination according to claim 1 wherein the receiver is a television receiver including tuners for the VHF and UHF bands, and each of the switch means is a three-position switch with one position corresponding to the UHF band and the other two positions corresponding to the high and low ends of the VHF band, respectively, with selection of either the high or low VHF band positions of the switch providing a DC operating potential to the VHF tuners from an associated energized stage of the counter, wherein the VHF tuner includes a tuning coil, with the setting of the switch to the high VHF band position causing a portion of the tuning coil in the VHF tuning circuit to be shunted.

5. The combination according to claim 1 wherein the switching device in each stage of said counter is a semiconductor switching device.

6. The combination according to claim 5 wherein the semiconductor switching devices are programmable unijunction transistors, the anodes of which are coupled with the source of DC potential and the cathodes of which constitutes the outputs of the stages of said counter circuit.